(12) United States Patent
Fouquet et al.

(10) Patent No.: US 7,948,067 B2
(45) Date of Patent: May 24, 2011

(54) COIL TRANSDUCER ISOLATOR PACKAGES

(75) Inventors: Julie E. Fouquet, Portola Valley, CA (US); Richard A. Baumgartner, Palo Alto, CA (US); Gary Tay, De Royal (SG); Dominique Ho, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 21 days.

(21) Appl. No.: 12/495,733

(22) Filed: Jun. 30, 2009

(65) Prior Publication Data
US 2010/0328902 A1 Dec. 30, 2010

(51) Int. Cl.
*H01L 23/495* (2006.01)
(52) U.S. Cl. ............ 257/666; 257/676; 257/E23.043; 257/E23.052
(58) Field of Classification Search .......... 257/666, 257/676, E23.043, E23.052
See application file for complete search history.

(56) References Cited

U.S. PATENT DOCUMENTS

| | | | |
|---|---|---|---|
| 4,027,152 A | 5/1977 | Brown et al. |
| 4,494,100 A | 1/1985 | Stengel et al. |
| 4,541,894 A | 9/1985 | Cassat |
| 4,931,075 A | 6/1990 | Kuhn |
| 5,070,317 A | 12/1991 | Bhagat |
| 5,312,674 A | 5/1994 | Haertling et al. |
| 5,363,081 A | 11/1994 | Bando et al. |
| 5,420,558 A | 5/1995 | Ito et al. |
| 5,597,979 A | 1/1997 | Courtney et al. |
| 5,659,462 A | 8/1997 | Chen et al. |
| 5,693,871 A | 12/1997 | Stout et al. |
| 5,716,713 A | 2/1998 | Zsamboky et al. |
| 5,754,088 A | 5/1998 | Fletcher et al. |
| 5,825,259 A | 10/1998 | Harpham |
| 5,952,849 A | 9/1999 | Haigh |
| 6,167,475 A | 12/2000 | Carr |
| 6,175,293 B1 | 1/2001 | Hasegawa et al. |
| 6,215,377 B1 | 4/2001 | Douriet et al. |
| 6,255,714 B1 | 7/2001 | Kossives et al. |
| 6,307,457 B1 | 10/2001 | Wissink et al. |
| 6,320,532 B1 | 11/2001 | Diede |
| 6,404,317 B1 | 6/2002 | Mizoguchi et al. |
| 6,476,704 B2 | 11/2002 | Goff |
| 6,489,850 B2 | 12/2002 | Heineke et al. |
| 6,501,364 B1 | 12/2002 | Hui et al. |
| 6,525,566 B2 | 2/2003 | Haigh et al. |

(Continued)

FOREIGN PATENT DOCUMENTS
CN 1180277 6/1996
(Continued)

OTHER PUBLICATIONS
U.S. Appl. No. 11/264,956, filed Nov. 1, 2005, Guenin et al.
(Continued)

*Primary Examiner* — Evan Pert

(57) ABSTRACT

In an embodiment, the invention provides a coil transducer isolator package comprising at least one lead frame, at least two integrated circuits (ICs) and a flex circuit comprising at least a first coil transducer. The first coil transducer comprises at least one metal coil. The coil transducer isolator package is fabricated such that no portion of the lead frame is physically located within a spatial volume extending substantially perpendicular to the at least one metal coil. The boundaries of the spatial volume are defined by a periphery of the at least one metal coil. At least one of the two ICs is at least partially located within the spatial volume extending substantially perpendicular to the at least one metal coil.

20 Claims, 6 Drawing Sheets

U.S. PATENT DOCUMENTS

| | | |
|---|---|---|
| 6,538,313 B1 | 3/2003 | Smith |
| 6,574,091 B2 | 6/2003 | Heineke et al. |
| 6,661,079 B1 | 12/2003 | Bikulcius et al. |
| 6,686,825 B2 | 2/2004 | Tamezawa et al. |
| 6,856,226 B2 | 2/2005 | Gardner |
| 6,859,130 B2 | 2/2005 | Nakashima et al. |
| 6,867,678 B2 | 3/2005 | Yang |
| 6,870,456 B2 | 3/2005 | Gardner |
| 6,873,065 B2 | 3/2005 | Haigh et al. |
| 6,888,438 B2 | 5/2005 | Hui et al. |
| 6,891,461 B2 | 5/2005 | Gardner |
| 6,903,578 B2 | 6/2005 | Haigh et al. |
| 6,919,775 B2 | 7/2005 | Wendt et al. |
| 6,922,080 B2 | 7/2005 | Haigh et al. |
| 6,943,658 B2 | 9/2005 | Gardner |
| 6,944,009 B2 | 9/2005 | Nguyen et al. |
| 6,970,040 B1 | 11/2005 | Dening |
| 7,064,442 B1 | 6/2006 | Lane et al. |
| 7,170,807 B2 | 1/2007 | Franzen et al. |
| 7,171,739 B2 | 2/2007 | Yang et al. |
| 7,376,116 B2 | 5/2008 | Rozenblitz et al. |
| 7,425,787 B2 | 9/2008 | Larson, III |
| 7,436,282 B2 | 10/2008 | Whittaker et al. |
| 7,460,604 B2 | 12/2008 | Dupuis |
| 2002/0075116 A1 | 6/2002 | Peels et al. |
| 2002/0110013 A1 | 8/2002 | Park et al. |
| 2003/0042571 A1 | 3/2003 | Chen et al. |
| 2004/0056749 A1 | 3/2004 | Kahlmann et al. |
| 2005/0003199 A1 | 1/2005 | Takaya et al. |
| 2005/0057277 A1 | 3/2005 | Chen et al. |
| 2005/0077993 A1 | 4/2005 | Kanno et al. |
| 2005/0094302 A1 | 5/2005 | Matsuzaki et al. |
| 2005/0128038 A1 | 6/2005 | Hyvonen |
| 2005/0133249 A1 | 6/2005 | Fujii |
| 2005/0269657 A1 | 12/2005 | Dupuis |
| 2005/0272378 A1 | 12/2005 | Dupuis |
| 2006/0028313 A1 | 2/2006 | Strzalkowski et al. |
| 2006/0095639 A1 | 5/2006 | Guenin et al. |
| 2006/0152322 A1 | 7/2006 | Whittaker et al. |
| 2006/0170527 A1 | 8/2006 | Braunisch |
| 2006/0176137 A1 | 8/2006 | Sato et al. |
| 2006/0214759 A1 | 9/2006 | Kawarai |
| 2006/0220775 A1 | 10/2006 | Ishikawa |
| 2007/0085447 A1 | 4/2007 | Larson, III |
| 2007/0085632 A1 | 4/2007 | Larson, III et al. |
| 2007/0086274 A1 | 4/2007 | Nishimura et al. |
| 2007/0133933 A1 | 6/2007 | Yoon et al. |
| 2007/0281394 A1 | 12/2007 | Kawabe et al. |
| 2007/0290784 A1 | 12/2007 | Nesse et al. |
| 2008/0007382 A1 | 1/2008 | Snyder |
| 2008/0031286 A1 | 2/2008 | Alfano et al. |
| 2008/0051158 A1 | 2/2008 | Male et al. |
| 2008/0061631 A1 | 3/2008 | Fouquet et al. |
| 2008/0174396 A1 | 7/2008 | Choi et al. |
| 2008/0176362 A1 | 7/2008 | Sengupta et al. |
| 2008/0198904 A1 | 8/2008 | Chang |
| 2008/0278275 A1 | 11/2008 | Fouquet |
| 2008/0284552 A1 | 11/2008 | Lim et al. |
| 2008/0308817 A1 | 12/2008 | Wang et al. |
| 2008/0311862 A1 | 12/2008 | Spina |
| 2009/0072819 A1 | 3/2009 | Takahashi |
| 2009/0180403 A1 | 7/2009 | Tudosoiu |
| 2010/0020448 A1 | 1/2010 | Ng et al. |
| 2010/0052120 A1 | 3/2010 | Pruitt |

FOREIGN PATENT DOCUMENTS

| | | |
|---|---|---|
| CN | 1237081 | 12/1999 |
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 2000-508116 | 6/2000 |
| JP | 2003-151829 | 5/2003 |
| JP | 2005-513824 | 5/2005 |
| WO | WO-9734349 | 3/1997 |
| WO | WO-2005/001928 | 6/2005 |
| WO | WO-2007/053379 | 5/2007 |

OTHER PUBLICATIONS

U.S. Appl. No. 11/512,034, filed Aug. 28, 2006, Fouquet et al.

U.S. Appl. No. 11/747,092, filed May 10, 2007, Fouquet et al.

"Texas Instruments Dual Digital Isolators", *SLLS755E* Jul. 2007.

Allflex Flexible Printed Circuit, , "Design Guide", <http://www.allflexinc.com> Retrieved Feb. 12, 2009.

Analog Devices, "iCoupler R Digital Isolation Products", 2005.

Analog Devices, Inc., "iCoupler Digital Isolator ADuM1100 Data Sheet,", *Rev F* 2006.

Avago Technologies, "ACCL-9xxx 3.3V/5V High Speed CMOS Capacitive Isolator", *Preliminary Datasheet*. 2005.

Chen, Baoxing et al., "High Speed Digital Isolators Using Microscale On-Chip Transformers", Jul. 22, 2003.

Chen, Baoxing, "iCoupler Products with iso Power Technology", *"Singal and Power Transfer Across Isolation Barrier Using Microtransformers" Abnalog Devices* 2006.

Electronic Design, , "Planar Transformers make Maximum Use of Precious Board Space", *Penton Media, Inc., ED Online ID #7647* Mar. 9, 1998.

Fiercewireless, "Skyworks Introduces Industry's First Multi-band, Multi-mode TDD/TDD Power Amplifier for 4G LTE Applications Next-Generation TEC", Dec. 18, 2008 , 6 pages.

Kliger, R., "Integrated Transformer-Coupled Isolation", Mar. 2003.

Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Transaction on vol. 54, Issue 11* Nov. 2006 , 3995-4001.

Myers, John et al., "GMR Isolators", Nonvalatile Electronics, Inc. 1998.

Oljaca, Miroslav, "Interfacing the ADS1202 Modulator with a Pulse Transformer in Galvanically Isolated Systems", *SBAA096* Jun. 2003 , 22 pages.

Payton Group International, "Off the Shelf SMT Planar Transformers", <http://www.paytongroup.com> Retrieved Mar. 31, 2008.

Rogers Corporation, , "Advanced Circuit Materials, High Frequency Laminates and Flexible Circuit Materials", <http://www.rogerscorporation.com/mwu/translations/prod.htm> Mar. 2008.

Smith, Carl H. et al., "Chip-Size Magnetic Sensor Arrays", May 21, 2002.

Yang, Ru-Yuan , "Loss Characteristics of Silicon Substrate with Different Resistivities", *Microwave and Optical Technology Letters, vol. 48, No. 9* Sep. 2006.

Analog Devices Hot-Swappable, Dual 12C Isolators, Analog.com.

COIL TRANSDUCER ISOLATOR PACKAGES

RELATED APPLICATIONS

This application claims priority and other benefits from, and is a continuation-in-part of, each of the following patent applications: (a) U.S. patent application Ser. No. 11/512,034 filed Aug. 28, 2006 entitled "Galvanic Isolator" to Fouquet et al. (hereafter "the '034 patent application"): (b) U.S. patent application Ser. No. 12/059,747 filed Mar. 31, 2008 entitled "Coil Transducer with Reduced Arcing and Improved High Voltage Breakdown Performance Characteristics" to Fouquet et al. (hereafter "the '747 patent application"): (c) U.S. patent application Ser. No. 12/059,979 filed Mar. 31, 2008 entitled "Galvanic Isolators and Coil Transducers" to Fouquet et al. (hereafter "the '979 patent application"): (d) U.S. patent application Ser. No. 12/370,208 filed Feb. 12, 2009 entitled "High Voltage Hold-off Coil Transducer" to Fouquet et al. (hereafter "the '208 patent application"): (e) U.S. patent application Ser. No. 12/392,978 filed Feb. 25, 2009 entitled "Miniature Transformers Adapted for Use in Galvanic Isolators and the Like" to Fouquet et al. (hereafter "the '978 patent application"): (f) U.S. patent application Ser. No. 12/393,596 filed Feb. 26, 2009 entitled "Minimizing Electromagnetic Interference in Coil Transducers" to Fouquet et al. (hereafter "the '596 patent application"); and (g) U.S. patent application Ser. No. 12/477,078 filed Jun. 2, 2009 entitled "Galvanic Isolator" to Gek Yong Ng. et al. (hereafter "the '078 patent application").

BACKGROUND

Electrical isolation barriers are typically used to electrically isolate one electrical system from another electrical system. For example a transformer used to step down a high voltage on a power line to a lower voltage used in homes contains an isolation barrier. In another example, an isolation transformer may be used to reduce high frequency noise often found at the power outlets of homes. The isolation transformer acts as a low-pass filter to remove high frequency noise.

Another type of electrical isolation barrier often used is optical isolation. Optical isolation uses light to send a signal from one electrical system to another electrical system while electrically isolating one electrical system from the other electrical system. For example, an LED (light emitting diode) may be used to transmit a signal from input circuitry through a fiber optic cable to a photo-detector. Often, a pulse train of light is used to represent the signal from the input circuitry. When the photo-detector receives the pulse train from the fiber optic cable, an output circuit reconstructs the pulse train into the original signal. An optoisolator may use a similar structure but with optical fiber replaced by a thin dielectric sheet.

Optical isolation systems often use more power than a magnetic induction isolation system. In addition, optical isolation systems are often slower than a magnetic induction system. Higher power consumption in an optical isolation system is due in part to the small number of photoelectrons generated in a photo-detector compared to the large number of photons generated in an LED.

A coil transducer formed as part of one or more substrates may be used in conjunction with a magnetic induction isolation system to reduce power and improve the speed of an electrical isolation barrier. A coil transducer may be, for example, a transformer. A material used to fabricate a substrate containing a coil transducer includes polyimide. A polyimide substrate containing a coil transducer may be larger than a silicon substrate containing a coil transducer. However, the electrical properties of a polyimide substrate containing a coil transducer help improve signal throughput and high voltage holdoff. In addition, a polyimide substrate containing a coil transducer is usually cheaper to produce than a silicon substrate containing a coil transducer.

DETAILED DESCRIPTION

The drawings and description, in general, disclose a coil transducer isolator package containing at least one lead frame, at least one flexible (flex) circuit, wire bonds and integrated circuits (ICs). The flex circuit contains one or more coil transducers. A coil transducer may contain one or more metal coils along with leads to and from the coil transducer. The coil transducer isolator package is constructed such that no portion of a lead frame is physically located within a spatial volume extending substantially perpendicular to a metal coil wherein the boundaries of the spatial volume are defined by the periphery of one or more metal coils. A benefit of constructing the coil transducer isolator package such that no portion of a lead frame is physically located within the spatial volume described above is that signal transmission through a coil transducer is not substantially reduced.

Figure 1:
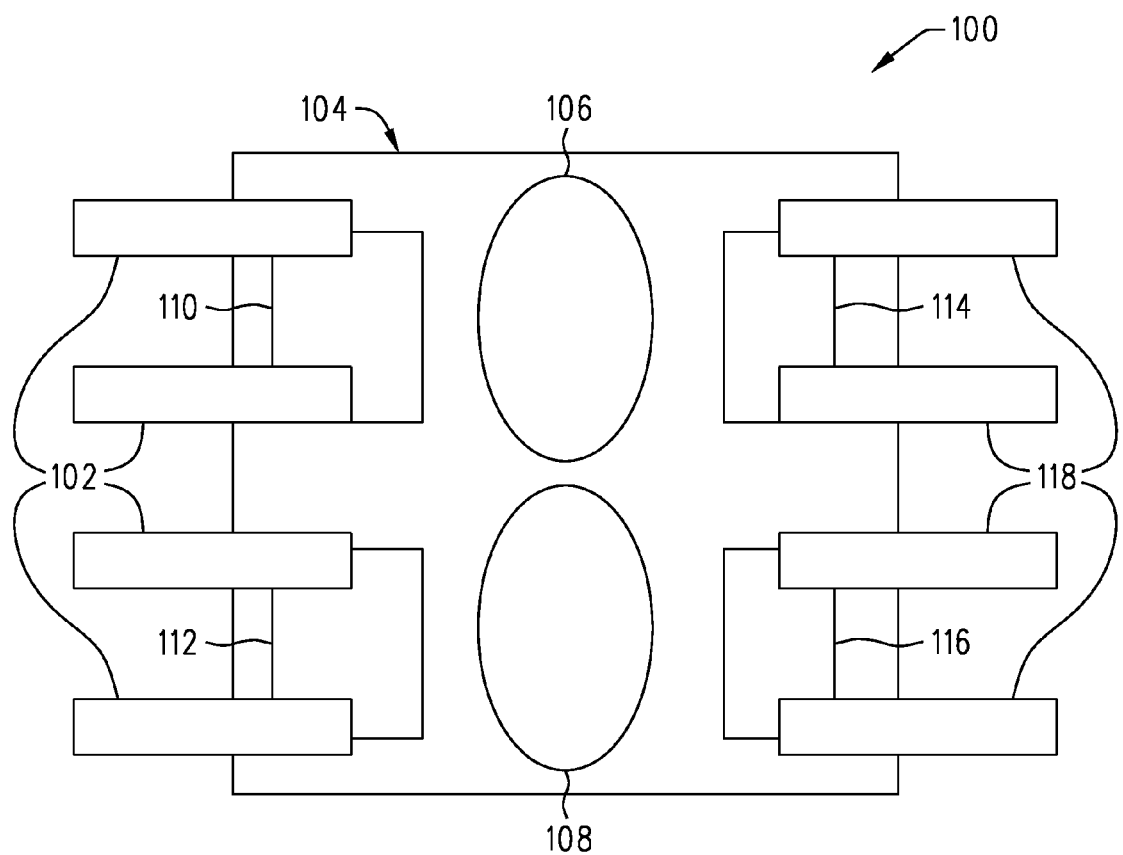
FIG. 1 is a top view of a coil transducer isolator package in accordance with a first exemplary embodiment of the invention.

FIG. 1 is a top view of a coil transducer isolator package 100 in accordance with a first exemplary embodiment of the invention. In this first exemplary embodiment, a first 106 and a second 108 coil transducer are part of the flex circuit 104. The flex circuit 104 may comprise polyimide for example. The flex circuit 104 may be comprised of other materials as well.

The coil transducer isolator package 100 in this example also includes four ICs 110, 112, 114, 116 and lead frames 102 and 118. In a first exemplary embodiment, ICs 110 and 112 are transmitter ICs while ICs 114 and 116 are receiver ICs.

However, in another exemplary embodiment, ICs 110 and 116 may be transmitters and ICs 112 and 114 may be receivers.

In this first exemplary embodiment, the transmitter ICs 110 and 112 are at least partially located under lead frame 102. In this first exemplary embodiment, the receiver ICs 114 and 116 are at least partially located under lead frame 118. Because the four ICs 110, 112, 114 and 116 are at least partially located under the lead frames 102 and 118 respectively, wire bonds (not shown) from the lead frame 102 to the ICs 110 and 112 and from lead frame 118 to ICs 114 and 116 may be reasonably short.

Because the wire bonds are reasonably short, the inductance created by the wire bonds is lower than it would have been when using longer wire bonds. Reducing the inductance of the wire bonds improves the speed of the coil transducer isolator package 100.

In this first exemplary embodiment, no portion of lead frames 102 and 118 are physically located over or under the first 106 or second 108 coil transducers. A benefit of constructing the coil transducer isolator package 100 such that no portion of lead frames 102 and 118 is physically located within a spatial volume extending substantially perpendicular to a metal coil in either of the coil transducers 106 and 108 wherein the boundaries of the spatial volume are defined by the periphery of the metal coils is that the signal transmission through a coil transducer is not substantially reduced. Another advantage of this embodiment of the invention is that the package 100 may be smaller than a package where the lead frames do not overlap the ICs. Alternatively, the coil transducers can be widened to use the extra space while still fitting in the original package size, thereby increasing coil transducer throughput.

Figure 2:
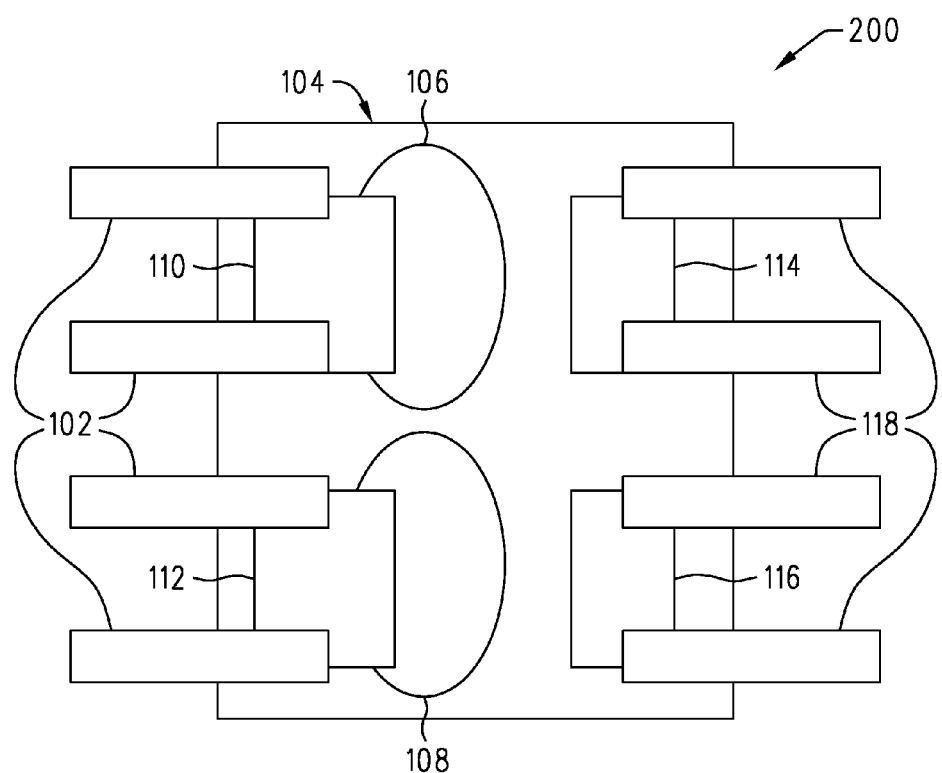
FIG. 2 is a top view of a coil transducer isolator package in accordance with a second exemplary embodiment of the invention.

FIG. 2 is a top view of a coil transducer isolator package 200 in accordance with a second exemplary embodiment of the invention. In this second exemplary embodiment, a first 106 and a second 108 coil transducer are part of the flex circuit 104. The flex circuit 104 may comprise polyimide for example. The flex circuit 104 may be comprised of other materials as well.

The coil transducer isolator package 200 also includes four ICs 110, 112, 114, 116 and lead frames 102 and 118. In this second exemplary embodiment, IC 110 is at least partially located over coil transducer 106. An insulator (not shown), for example kapton, is located between the IC 110 and the coil transducer 106. In an exemplary embodiment, the thickness of the kapton is about 2 mils (one thousandth of an inch). In another exemplary embodiment, air may be used as an insulator. In this example, at least part of lead frame 102 is located over IC 110.

In this second exemplary embodiment, IC 112 is at least partially located over coil transducer 108. An insulator (not shown), for example kapton, is located between the IC 112 and the coil transducer 108. In an exemplary embodiment, the thickness of the kapton is about 2 mils. In another exemplary embodiment, air may be used as an insulator. In this example, at least part of lead frame 102 is located over IC 112. Because ICs 110 and 112 are at least partially located above coil transducers 106 and 108 respectively and because lead frames 102 and 118 are at least partially located over ICs 110, 112, 114, and 116 respectively, the package 200 may be narrower when compared to package 100. Alternatively, the coil transducers can be widened to use the extra space while still fitting in the original package size, thereby increasing coil transducer throughput.

In this second exemplary embodiment, two ICs, 114 and 116 are partially located under lead frame 118. Because the two ICs, 114 and 116 are partially located under lead frame 118, wire bonds (not shown) from the lead frame 118 to the ICs 114 and 116 may be reasonably short. Because the wire bonds are reasonably short, the inductance created by the wire bonds is lower than it would have been when using longer wire bonds. Reducing the inductance of the wire bonds improves the speed of the coil transducer isolator package 200.

Figure 3:
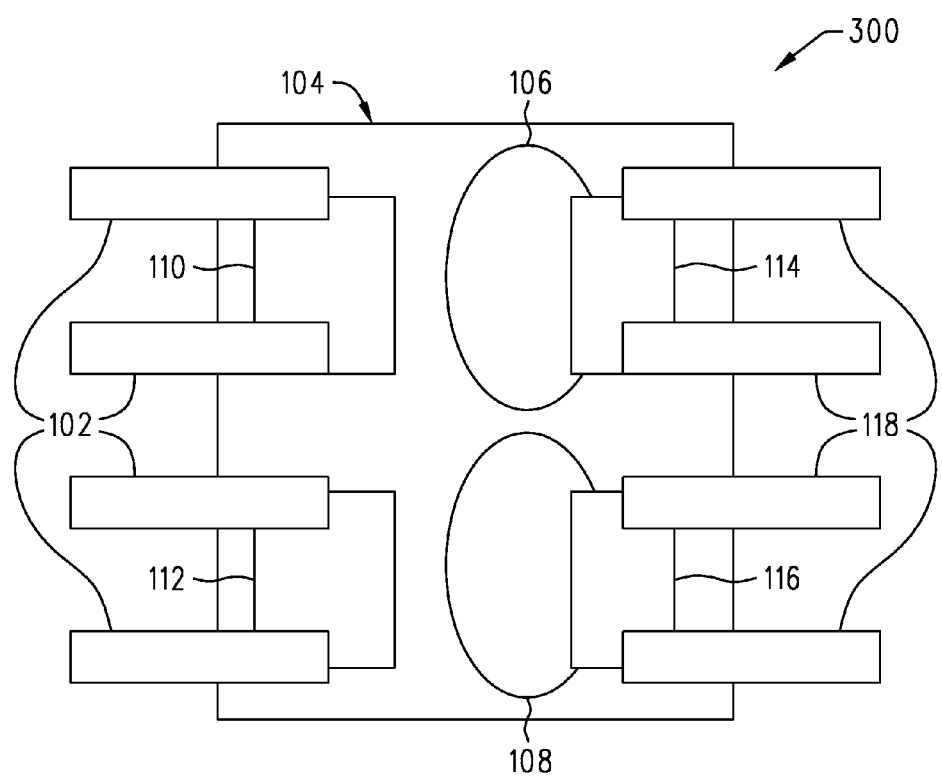
FIG. 3 is a top view of a coil transducer isolator package in accordance with a third exemplary embodiment of the invention.

FIG. 3 is a top view of a coil transducer isolator package 300 in accordance with a third exemplary embodiment of the invention. In this third exemplary embodiment, a first 106 and a second 108 coil transducer are part of the flex circuit 104. The flex circuit 104 may comprise polyimide for example. The flex circuit 104 may be comprised of other materials as well.

The coil transducer isolator package 300 also includes four ICs 110, 112, 114, 116 and lead frames 102 and 118. In this third exemplary embodiment, IC 114 is partially located over coil transducer 106. An insulator (not shown), for example kapton, is located between the IC 114 and the coil transducer 106. In another exemplary embodiment, air may be used as an insulator. In an exemplary embodiment, the thickness of the kapton is about 2 mils. In this example, at least part of lead frame 118 is located over IC 114.

In this third exemplary embodiment, IC 116 is partially located over coil transducer 108. An insulator (not shown), for example kapton, is located between the IC 116 and the coil transducer 108. In an exemplary embodiment, the thickness of the kapton is about 2 mils. In another exemplary embodiment, air may be used as an insulator. In this example, at least part of lead frame 118 is located over IC 116. Because ICs 114 and 116 are located above coil transducers 106 and 108 respectively and because lead frames 102 and 118 are at least partially located over ICs 110, 112, 114, and 116 respectively, the package 300 may be narrower when compared to package 100. Alternatively, the coil transducers can be widened to use the extra space while still fitting in the original package size, thereby increasing coil transducer throughput.

In this third exemplary embodiment, two ICs, 110 and 112 are partially located under the lead frame 102. Because the two ICs, 110 and 112 are at least partially located under the lead frame 102, wire bonds (not shown) from the lead frame 102 to the ICs 110 and 112 may be reasonably short. Because the wire bonds are reasonably short, the inductance created by the wire bonds is lower than it would have been when using longer wire bonds. Reducing the inductance of the wire bonds improves the speed of the coil transducer isolator package 300.

Figure 4:
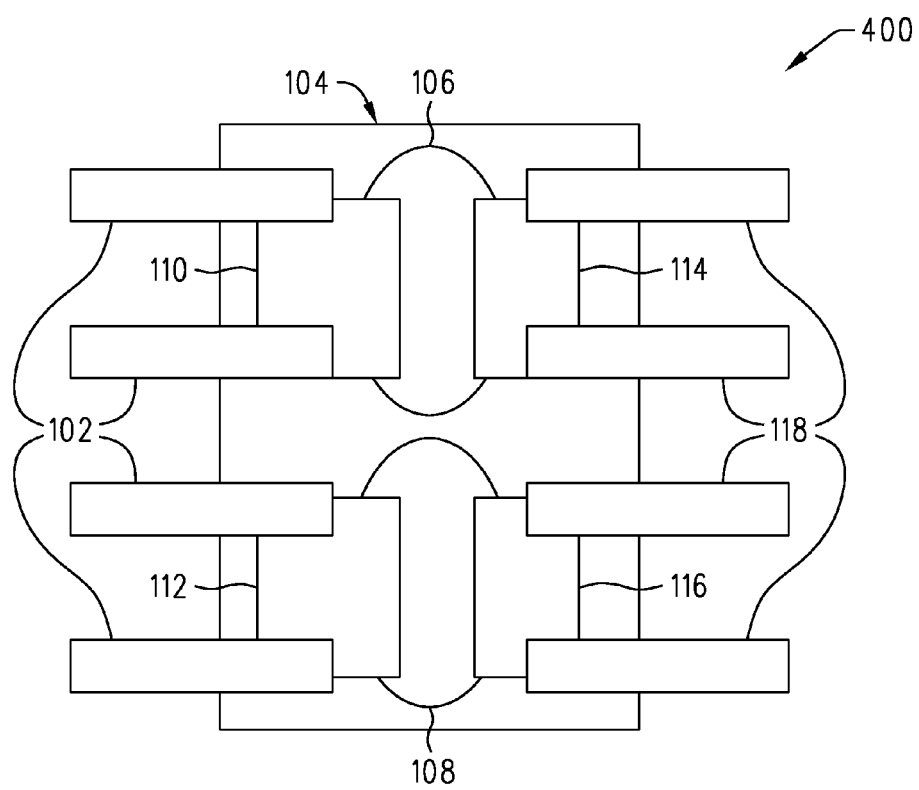
FIG. 4 is a top view of a coil transducer isolator package in accordance with a fourth exemplary embodiment of the invention.

FIG. 4 is a top view of a coil transducer isolator package 400 in accordance with a fourth exemplary embodiment of the invention. In this fourth exemplary embodiment, a first 106 and a second 108 coil transducer are part of the flex circuit 104. The flex circuit 104 may comprise polyimide for example. The flex circuit 104 may be comprised of other materials as well.

The coil transducer isolator package 400 also includes four ICs 110, 112, 114, 116 and lead frames 102 and 118. In this fourth exemplary embodiment, ICs 110 and 114 are at least partially located over coil transducer 106. An insulator (not shown), for example kapton, is located between a plane formed by ICs 110 and 114 and the coil transducer 106. In an exemplary embodiment, the thickness of the kapton is about 2 mils. In another exemplary embodiment, air may be used as an insulator. In this example at least part of lead frame 102 is located over ICs 110 and 112 and at least part of lead frame 118 is located over ICs 114 and 116.

In this fourth exemplary embodiment, ICs 112 and 116 are at least partially physically located over coil transducer 108. An insulator (not shown), for example kapton, is located between the plane formed by ICs 112 and 116 and the coil transducer 108. In an exemplary embodiment, the thickness of the kapton is about 2 mils. In another exemplary embodiment, air may be used as an insulator. Because ICs 110, 112, 114 and 116 are at least partially located above coil transducers 106 and 108 and because lead frames 102 and 118 are at least partially located over ICs 110, 112, 114, and 116 respectively, the package 400 may be narrower when compared to package 100. Alternatively, the coil transducers can be widened to use the extra space while still fitting in the original package size, thereby increasing coil transducer throughput.

Figure 5:
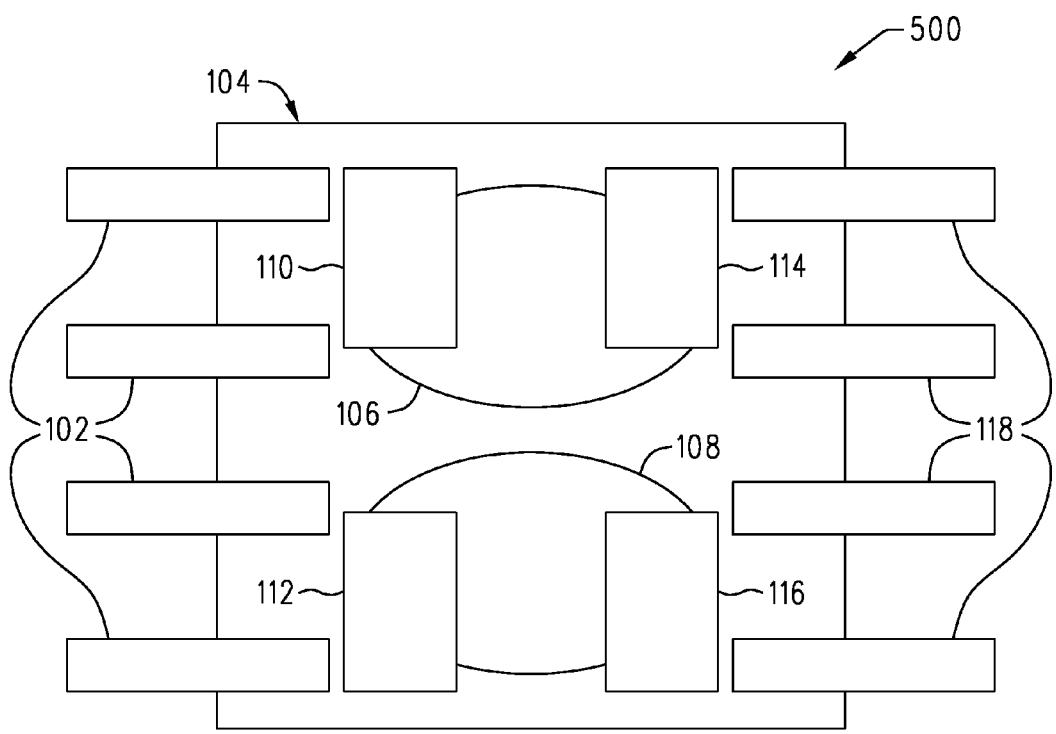
FIG. 5 is a top view of a coil transducer isolator package in accordance with a fifth exemplary embodiment of the invention.

FIG. 5 is a top view of a coil transducer isolator package 500 in accordance with a fifth exemplary embodiment of the invention. In this fifth exemplary embodiment, a first 106 and a second 108 coil transducer are part of the flex circuit 104. The flex circuit 104 may comprise polyimide for example. The flex circuit 104 may be comprised of other materials as well.

The coil transducer isolator package 500 in this example also includes four ICs 110, 112, 114, 116 and lead frames 102 and 118. In this fifth exemplary embodiment, ICs 110 and 112 are transmitter ICs while ICs 114 and 116 are receiver ICs. However, in another exemplary embodiment, ICs 110 and 116 may be transmitters and ICs 112 and 114 may be receivers. In this fifth exemplary embodiment, the ICs 110 and 112 are at least partially located over coil transducer 106. In this fifth exemplary embodiment, no part of lead frame 102 extends over ICs 110 or 112 or over coil transducer 106.

In this fifth exemplary embodiment, ICs 114 and 116 are receiver ICs. In this fifth exemplary embodiment, the ICs 114 and 116 are at least partially located over coil transducers 106 and 108 respectively. In this example, no part of lead frame 118 extends over ICs 114 or 116 or over coil transducers 106 or 108.

In this fifth exemplary embodiment, no portion of the lead frames 102 and 118 are physically located within a spatial volume extending substantially perpendicular to the metal coils wherein the boundaries of the spatial volume are defined by the periphery of the metal coils. A benefit of constructing the coil transducer isolator package 500 such that no portion of the lead frames 102 and 118 are physically located within a spatial volume extending substantially perpendicular to the metal coils wherein the boundaries of the spatial volume are defined by the periphery of the metal coils is that signal transmission through a coil transducer is not significantly reduced. Because ICs 110, 112, 114 and 116 are at least partially located above coil transducers 106 and 108, the package 500 may be smaller when compared to a package where the ICs do not overlap the coil transducers. Alternatively, the coil transducers can be widened to use the extra space while still fitting in the original package size, thereby increasing coil transducer throughput.

Figure 6:
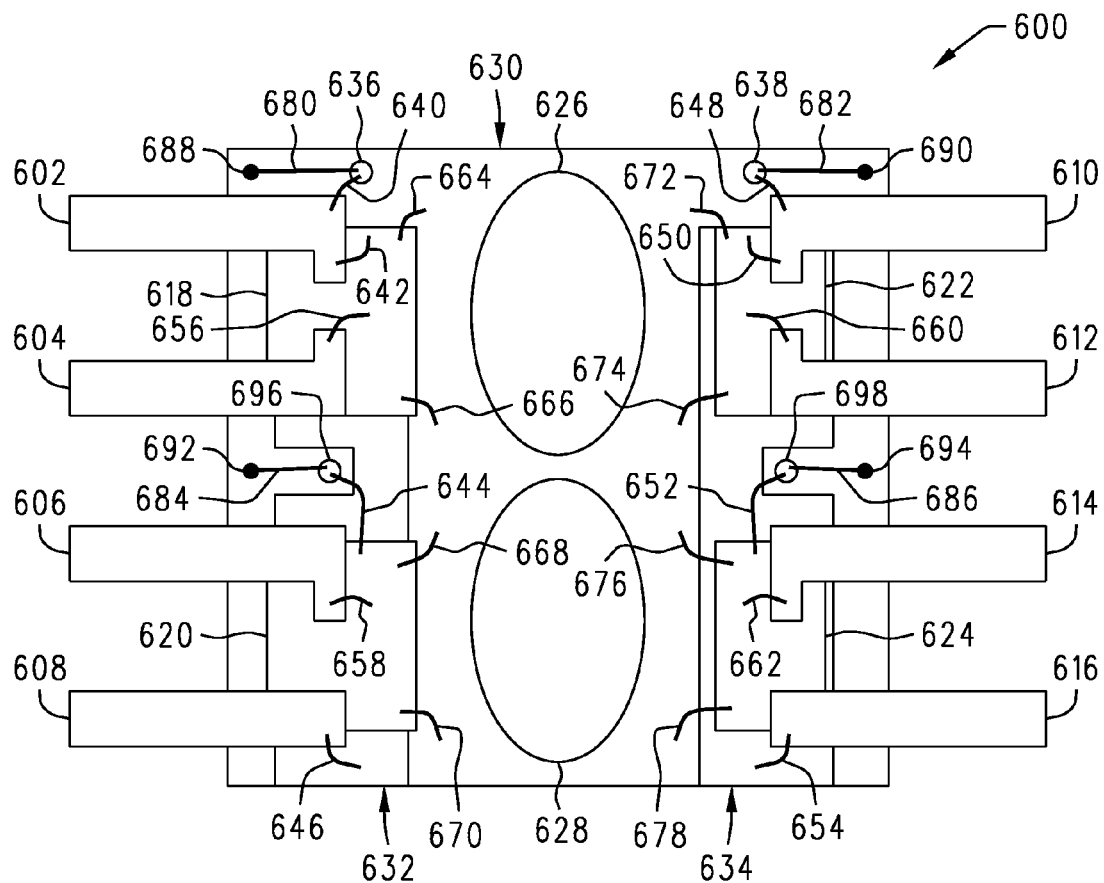
FIG. 6 is a top view of a coil transducer isolator package in accordance with a sixth exemplary embodiment of the invention.

FIG. 6 is a top view of a coil transducer isolator package 600 in accordance with a sixth exemplary embodiment of the invention. In this sixth exemplary embodiment, a first 626 and a second 628 coil transducer are part of the flex circuit 630. The flex circuit 630 also includes ground pads 632, 634, bond pads 636, 638, 696, 698, metal traces 680, 682, 684, 686 and vias 688, 690, 692, 694. The flex circuit 630 may comprise polyimide for example. The flex circuit 630 may be comprised of other materials as well.

The coil transducer isolator package 600 in this example also includes four ICs 618, 620, 622, 624, eight leads 602, 604, 606, 608, 610, 612, 614, 616, wire bonds and two lower lead frames 706 and 708. In this sixth exemplary embodiment, ICs 618 and 620 are transmitter ICs while ICs 622 and 624 are receiver ICs. However, in another exemplary embodiment, ICs 618 and 624 may be transmitters and ICs 622 and 620 are receivers. In this sixth exemplary embodiment, IC 618 is located under leads 602 and 604; IC 620 is located under leads 606 and 608; IC 622 is located under leads 610 and 612 and IC 624 is located under leads 614 and 616. Because the four ICs 618, 620, 622 and 624 are at least partially located under the lead frame leads, wire bonds from the lead frame leads to the ICs 618, 620, 622 and 624 may be reasonably short. Another advantage of this embodiment of the invention is that the package 600 may be smaller than a package where the lead frame leads do not overlap the ICs. Alternatively, the coil transducers can be widened to use the extra space while still fitting in the original package size, thereby increasing coil transducer throughput.

Because the wire bonds are reasonably short, the inductance created by the wire bonds is lower than it would have been when using longer wire bonds. Reducing the inductance of the wire bonds improves the speed of the coil transducer isolator package 600.

In this sixth exemplary embodiment, lead 602 supplies power supply voltage VDD1. Wire bond 640 electrically connects VDD1 to bonding is pad 636. Bonding pad 636 is connected to metal trace 680. Metal trace 680 connects to via 688. Via 688 is connected to bus 710 (not shown in FIG. 6). Wire bond 642 electrically connects VDD1 to IC 618. Lead 604 carries a first signal. Wire bond 656 electrically connects lead 604 to an input of IC 618. Lead 606 carries a second signal. Wire bond 658 electrically connects lead 606 to an input of IC 620. Wire bond 644 is connected to bond pad 696 and IC 620. Bond pad 696 is connected to metal trace 684. Metal trace 684 is connected to via 692. Via 692 is connected to bus 710 (not shown in FIG. 6). Bus 710 is at voltage VDD1. Lead 608 supplies GND1. Wire bond 646 electrically connects GND1 ground pad 632.

In this sixth exemplary embodiment, lead 610 supplies power supply voltage VDD2. Wire bond 648 electrically connects VDD2 to bond pad 638. Bond pad 638 is connected to metal trace 682. Metal trace 682 connects to via 690. Via 690 is connected to bus 712 (not shown in FIG. 6). Bus 712 is at voltage VDD2. Wire bond 650 electrically connects voltage VDD2 to IC 622. Lead 612 carries a third signal. Wire bond 660 electrically connects lead 612 to an output of IC 622. Lead 614 carries a fourth signal from IC 624. Wire bond 662 electrically connects lead 614 to an output of IC 624. Wire bond 652 is connected to bond pad 698 and IC 622. Bond pad 698 is connected to metal trace 686. Metal trace 686 is connected to via 694. Via 694 is connected to bus 712 (not shown in FIG. 6). Bus 712 is at voltage VDD2. Lead 616 supplies GND2. Wire bond 654 electrically connects GND2 to ground pad 634.

In this sixth exemplary embodiment, wire bonds 664 and 666 connect a differential output from IC 618 to a differential input on the first coil transducer 626. Wire bonds 672 and 674 connect a different output from the first coil transducer 626 to a differential input on IC 622. Wire bonds 668 and 670 connect a differential output from IC 620 to a differential input on the second coil transducer 628. Wire bonds 676 and 678 connect a different output from the second coil transducer 628 to a differential input on IC 624.

Figure 7:
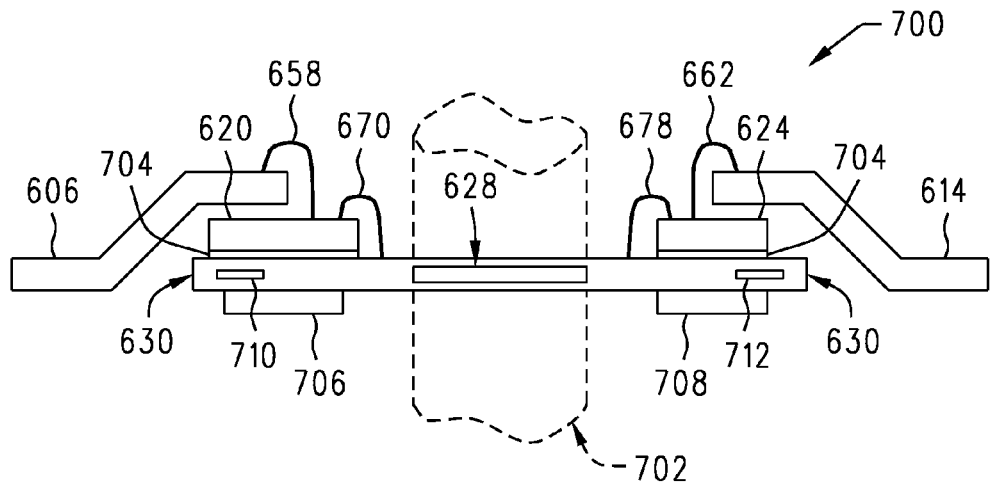
FIG. 7 is a cross-sectional view of a coil transducer isolator package in accordance with a sixth exemplary embodiment of the invention.

FIG. 7 is a cross-sectional view of a coil transducer isolator package 700 in accordance with a sixth exemplary embodiment of the invention. In this sixth exemplary embodiment, lead 606 carries a signal to wire bond 658. Wire bond 658 is electrically connected to an input of IC 620. Lead 614 carries a signal from wire bond 662. Wire bond 662 is electrically connected to an output of IC 624. Wire bond 644 electrically connects one leg of a differential output from IC 620 to one leg of a differential input of coil transducer 628. Wire bond 676 electrically connects one leg of the differential output from coil transducer 628 to one leg of the differential input of IC 624. Bus 710 is at voltage VDD1. Bus 712 is at voltage VDD2. In this example, lower lead frames 706 and 708 are connected to GND1 and GND2 respectively.

In this sixth exemplary embodiment, part of coil transducer 628 is shown as part of flex circuit 630. Conductive epoxy 704, for example, may be used to attach ICs 620 and 624 to flex circuit 630. Other means such as non-conductive epoxy and double-sided adhesive tape may be used to attach ICs 620 and 624 to flex circuit 630. A spatial volume 702 extending substantially perpendicular to the coil transducer 628 is shown to illustrate that no portion of the leads 602, 604, 606, 608, 610, 612, 614 and 616 fall within the spatial volume 702. The boundaries of the spatial volume 702, in this example, are defined by the periphery of the metal coils of the coil transducer 628.

A benefit of constructing the coil transducer isolator package 700 such that no portion of leads 602, 604, 606, 608, 610, 612, 614 and 616 is physically located within a spatial volume 702 is that signal transmission through the coil transducer 628 is not substantially reduced.

Figure 8:
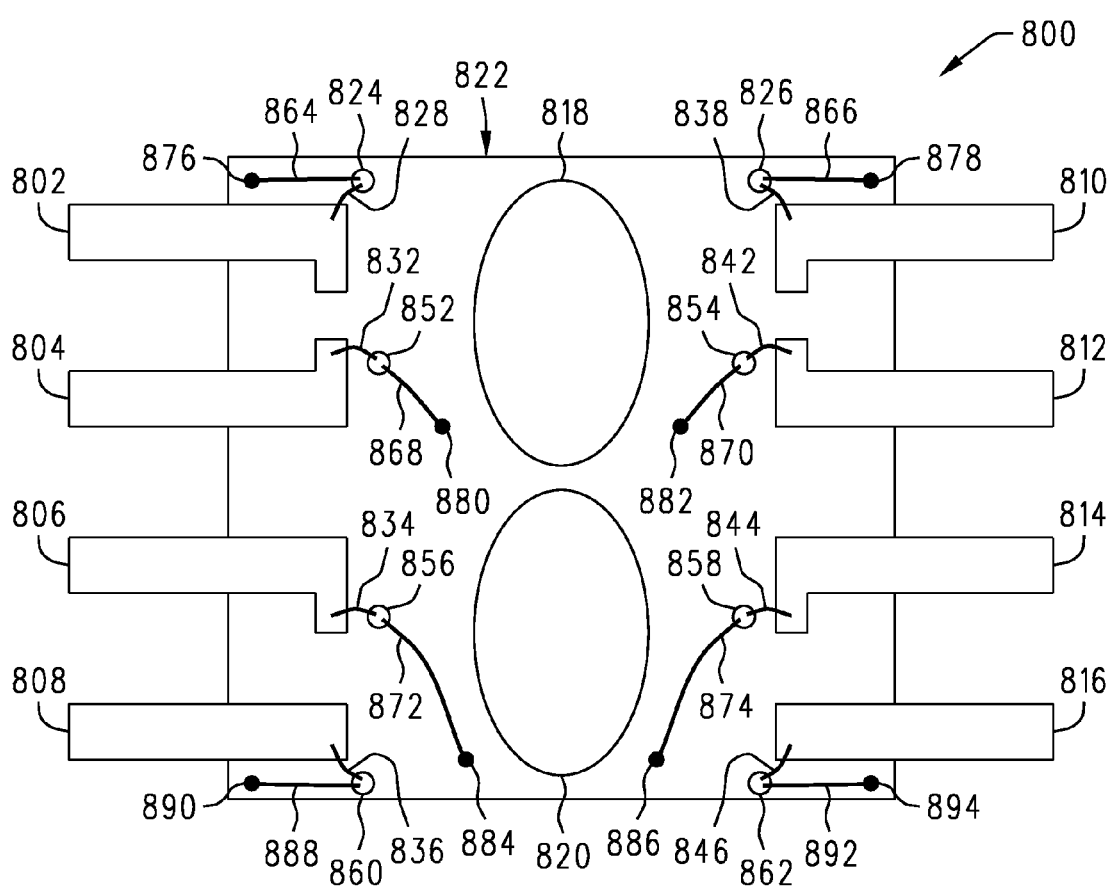
FIG. 8 is a top view of a coil transducer isolator package in accordance with a seventh exemplary embodiment of the invention.

FIG. 8 is a top view of a coil transducer isolator package 800 in accordance with a seventh exemplary embodiment of the invention. In this seventh exemplary embodiment, a first 818 and a second 820 coil transducer are fabricated on flex circuit 822. The flex circuit 822 also includes bond pads 824, 826, 852, 854, 856, 858, 860, 862, metal traces 864, 866, 868, 870, 872, 874, 888, 892 and vias 876, 878, 880, 882, 884, 886, 890, 894. The flex circuit 822 may comprise polyimide for example. The flex circuit 822 may be comprised of other materials as well.

The coil transducer isolator package 800 in this example also includes four ICs (not shown), eight leads 802, 804, 806, 808, 810, 812, 814, 816 and wire bonds. In this seventh exemplary embodiment, four ICs (not shown) are located under leads 802, 804, 806, 808, 810, 812, 814, and 816 and the flex circuit 822. Another advantage of this embodiment of the invention is that the package 800 may be smaller than a package where the lead frame leads do not overlap the ICs. Alternatively, the coil transducers can be widened to use the extra space while still fitting in the original package size, thereby increasing coil transducer throughput.

In this seventh exemplary embodiment, lead 802 supplies power supply voltage VDD1 to bond pad 824. Bond pad 824 is connected to metal trace 864. Metal trace 864 is connected to via 876. Via 876 is connected to bus 922 (not shown in FIG. 8). Bus 922 is at voltage VDD1. Lead 804 carries a first signal. Wire bond 832 electrically connects lead 804 to bond pad 852 on the flex circuit 822. Bond pad 852 is connected to metal trace 868. Metal trace 868 is connected to via 880. Lead 806 carries a second signal. Wire bond 834 electrically connects lead 806 to bond pad 856 on the flex circuit 822. Bond pad 856 is connected to metal trace 872. Metal trace 872 is connected to via 884. Lead 808 supplies GND1. Wire bond 836 electrically connects to bond pad 860. Bond pad 860 is connected to metal trace 888. Metal trace 888 is connected to via 890.

In this seventh exemplary embodiment, lead 810 supplies power supply voltage VDD2 to bond pad 826 through wire bond 838. Bond pad 826 is connected to metal trace 866. Metal trace 866 is connected to via 878. Via 878 is connected to bus 924 (not shown in FIG. 8). Bus 924 is at voltage VDD2. Lead 812 carries a third signal. Wire bond 842 electrically connects lead 812 to bond pad 854 on the flex circuit 822. Bond pad 854 is connected to metal trace 870. Metal trace 870 is connected to via 882. Lead 814 carries a fourth signal. Wire bond 844 electrically connects lead 814 to bond pad 858 on the flex circuit 822. Bond pad 858 is connected to metal trace 874. Metal trace 874 is connected to via 886. Lead 816 supplies GND2. Wire bond 846 electrically connects to bond pad 862. Bond pad 862 is connected to metal trace 892. Metal trace 892 is connected to via 894.

Figure 9:
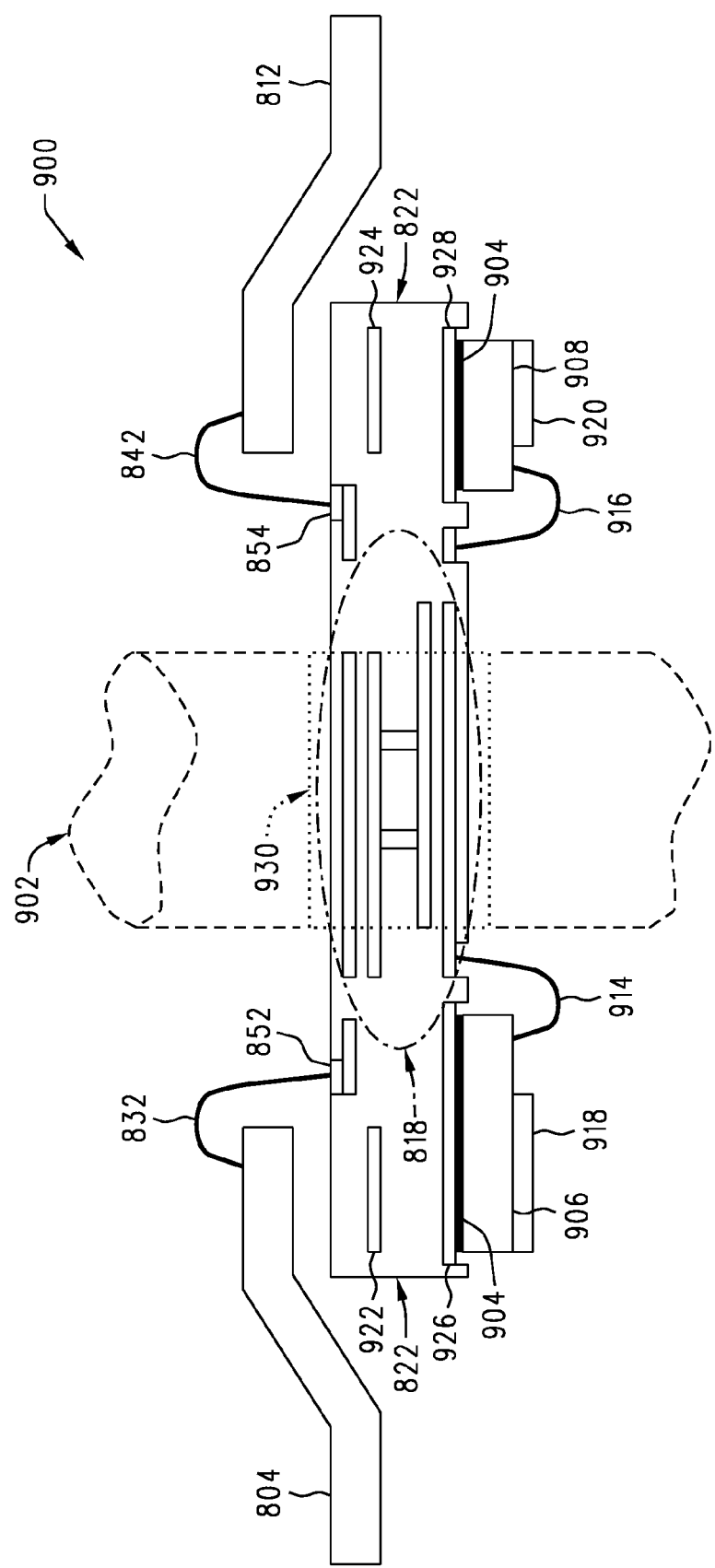
FIG. 9 is a cross-sectional view of a coil transducer isolator package in accordance with a seventh exemplary embodiment of the invention.

FIG. 9 is a cross-sectional view of a coil transducer isolator package 900 in accordance with a seventh exemplary embodiment of the invention. In this seventh exemplary embodiment, lead 804 carries a signal to wire bond 832. Wire bond 832 is electrically connected to bond pad 852 in the flex circuit 822. Wire bond 914 electrically connects one leg of a differential output from IC 906 to one leg of a differential input of coil transducer 818.

In this seventh exemplary embodiment, lead 812 carries a signal from wire bond 842. Wire bond 842 is electrically connected to bond pad 854 on the flex circuit 822. Wire bond 916 electrically connects one leg of a differential output from coil transducer 818 to one leg of a differential input of IC 908.

In this seventh exemplary embodiment, part of coil transducer 818 is shown as part of flex circuit 822. Conductive epoxy 904, for example, may be used to attach ICs 906 and 908 to flex circuit 822. Other means such as non-conductive epoxy and double-sided adhesive tape may be used to attach ICs 906 and 908 to flex circuit 822. Bus 922 is at voltage VDD1. Bus 924 is at voltage VDD2. Ground pad 926 is at voltage GND1. Ground pad 928 is at voltage GND2. A spatial volume 902 extending substantially perpendicular to metal coil 930 is shown to illustrate that no portion of the leads 802, 804, 806, 808, 810, 812, 814 and 816 fall within the spatial volume 902. The boundaries of the spatial volume 902, in this example, are defined by the periphery of a metal coil 930 that is part of coil transducer 818.

A benefit of constructing the coil transducer isolator package 800 such that no portion of leads 802, 804, 806, 808, 810, 812, 814 and 816 is physically located within a spatial volume 902 is that the signal transmission through coil transducer 822 is not substantially reduced.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A coil transducer isolator package comprising:
   at least one lead frame;
   at least a first and a second IC (integrated circuit);
   a flex circuit, the flex circuit comprising at least a first coil transducer;
   wherein the at least first coil transducer comprises at least one metal coil;
   wherein no portion of the at least one lead frame is physically located within a spatial volume extending substantially perpendicular to the at least one metal coil;
   wherein boundaries of the spatial volume are defined by a periphery of the at least one metal coil;

wherein the at least first IC is at least partially located within the spatial volume extending substantially perpendicular to the at least one metal coil.

2. The coil transducer isolator package as in claim 1 wherein the flex circuit further comprises polyimide.

3. The coil transducer isolator package as in claim 1 wherein the at least first coil transducer is a transformer.

4. The coil transducer isolator package as in claim 1 wherein the at least first IC is a transmitter.

5. The coil transducer isolator package as in claim 1 wherein the at least second IC is a receiver.

6. The coil transducer isolator package as in claim 1 wherein a distance of approximately two mils or more is maintained between the at least one metal coil and the at least first IC.

7. The coil transducer isolator package as in claim 6 wherein one or more electrical insulating materials are positioned between the at least first IC and the at least one metal coil.

8. The coil transducer isolator package as in claim 7 wherein the electrical insulator material is selected from a group consisting of kapton, polyimide and a combination of epoxy resin and glass fiber.

9. The coil transducer isolator package as in claim 1 wherein the at least second IC is at least partially located within the spatial volume extending substantially perpendicular to the at least one metal coil.

10. The coil transducer isolator package as in claim 1 wherein a distance of approximately two mils or more is maintained between the at least one metal coil and the at least second IC.

11. The coil transducer isolator package as in claim 10 wherein one or more electrical insulating materials are positioned between the at least second IC and the at least one metal coil.

12. The coil transducer isolator package as in claim 11 wherein the electrical insulator material is selected from a group consisting of kapton, polyimide and a combination of epoxy resin and glass fiber.

13. The coil transducer isolator package as in claim 1 wherein at least a portion of the at least one lead frame is physically located over the at least first IC.

14. The coil transducer isolator package as in claim 9 wherein at least a portion of the at least one lead frame is physically located over the at least second IC.

15. The coil transducer isolator package as in claim 9 wherein at least a portion of the at least one lead frame is physically located over the at least first IC and over the at least second IC.

16. A coil transducer isolator package comprising:
at least one lead frame;
at least a first and a second IC (integrated circuit);
a flex circuit, the flex circuit comprising at least a first coil transducer;
    wherein the at least first coil transducer comprises at least one metal coil;
    wherein no portion of the at least one lead frame is physically located within a spatial volume extending substantially perpendicular to the at least one metal coil;
    wherein boundaries of the spatial volume are defined by a periphery of the at least one metal coil;
    wherein no portion of the at least first and second ICs are physically located within the spatial volume extending substantially perpendicular to the at least one metal coil;
    wherein at least a portion of the at least one lead frame is physically located over the at least first IC.

17. The coil transducer isolator package as in claim 16 wherein at least a portion of the at least one lead frame is physically located over the at least second IC.

18. A coil transducer isolator package comprising:
a lead frame;
at least a first and a second IC (integrated circuit), the at least first IC having a first input and a differential output, the at least second IC having a differential input and an output;
a flex circuit, the flex circuit comprising at least a first coil transducer, ground pads and internal supply voltage routing;
    wherein the at least first coil transducer comprises at least one metal coil;
    wherein the at least first coil transducer has a differential input and a differential output;
    wherein the differential input of the at least first coil transducer is electrically connected to the differential output of the at least first IC;
    wherein the differential output of the at least first coil transducer is electrically connected to the differential input of the at least second IC;
    wherein no portion of the lead frame is physically located within a spatial volume extending substantially perpendicular to the at least one metal coil;
    wherein boundaries of the spatial volume are defined by a periphery of the at least one metal coil.

19. The coil transducer isolator package as in claim 18 wherein the lead frame comprises at least six leads;
    wherein a voltage $VDD_1$ is applied to a first lead;
    wherein a first electrical signal is applied to a second lead;
    wherein a voltage $GND_1$ is applied to a third lead;
    wherein a voltage $VDD_2$ is applied to a fourth lead;
    wherein a second electrical signal is received from a fifth lead;
    wherein a voltage $GND_2$ is applied to a sixth lead.

20. The coil transducer isolator package as in claim 19 wherein the first lead is wire bonded to a first internal supply voltage routing and the at least first IC;
    wherein the second lead is wire bonded to the input of the at least first IC;
    wherein the third lead is wire bonded to a first ground pad;
    wherein the fourth lead is wire bonded to a second internal voltage routing and the at least second IC;
    wherein the fifth lead is wire bonded to the output of the at least second IC;
    wherein the sixth lead is wire bonded to a second ground pad.

* * * * *